United States Patent
Toyoshima et al.

(10) Patent No.: US 7,038,767 B2
(45) Date of Patent: May 2, 2006

(54) THREE-DIMENSIONAL MICROPATTERN PROFILE MEASURING SYSTEM AND METHOD

(75) Inventors: Yuya Toyoshima, Tokyo (JP); Yasuhiro Mitsui, Fuchuu (JP); Yasutsugu Usami, Tokyo (JP); Isao Kawata, Sayama (JP); Tadashi Otaka, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/289,401

(22) Filed: Nov. 7, 2002

(65) Prior Publication Data
US 2003/0090651 A1 May 15, 2003

(30) Foreign Application Priority Data
Nov. 13, 2001 (JP) .............................. 2001-346845

(51) Int. Cl.
*G01N 21/00* (2006.01)

(52) U.S. Cl. ..................... 356/72; 250/492.3; 356/634; 356/635

(58) Field of Classification Search ................ 356/72, 356/634, 635, 636, 400, 401; 250/492.2, 250/492.3; 422/5, 22, 30
See application file for complete search history.

(56) References Cited

U.S. PATENT DOCUMENTS

| | | | | |
|---|---|---|---|---|
| 5,607,800 A | * | 3/1997 | Ziger | ...................... 250/559.2 |
| 6,151,120 A | * | 11/2000 | Matsumoto et al. | ........ 356/399 |
| 6,388,253 B1 | * | 5/2002 | Su | ........................... 250/492.2 |
| 6,407,373 B1 | * | 6/2002 | Dotan | ..................... 250/201.3 |
| 6,650,424 B1 | * | 11/2003 | Brill et al. | .................. 356/635 |

FOREIGN PATENT DOCUMENTS

| | | |
|---|---|---|
| JP | 4-342942 | 11/1992 |
| JP | 8-255751 | 10/1996 |

* cited by examiner

*Primary Examiner*—Layla G. Lauchman
*Assistant Examiner*—Juan D. Valentin, II
(74) *Attorney, Agent, or Firm*—Dickstein Shapiro Morin & Oshinsky LLP

(57) ABSTRACT

A light beam is emitted to a test pattern place formed in the scribe area on the wafer for height measurement, an electron beam is emitted to the test pattern place for width and contrast measurement and their correlations are stored. The three-dimensional profile of a pattern in a semiconductor device on the wafer is determined by irradiating the pattern with an electron beam to measure the width and contrast and estimating the height of the pattern by inferring from a correlation corresponding to the measured width and contrast. Thus, a three-dimensional profile measuring system and method capable of measuring the three-dimensional profile of a micropattern in a semiconductor device without cutting the wafer are provided.

4 Claims, 5 Drawing Sheets

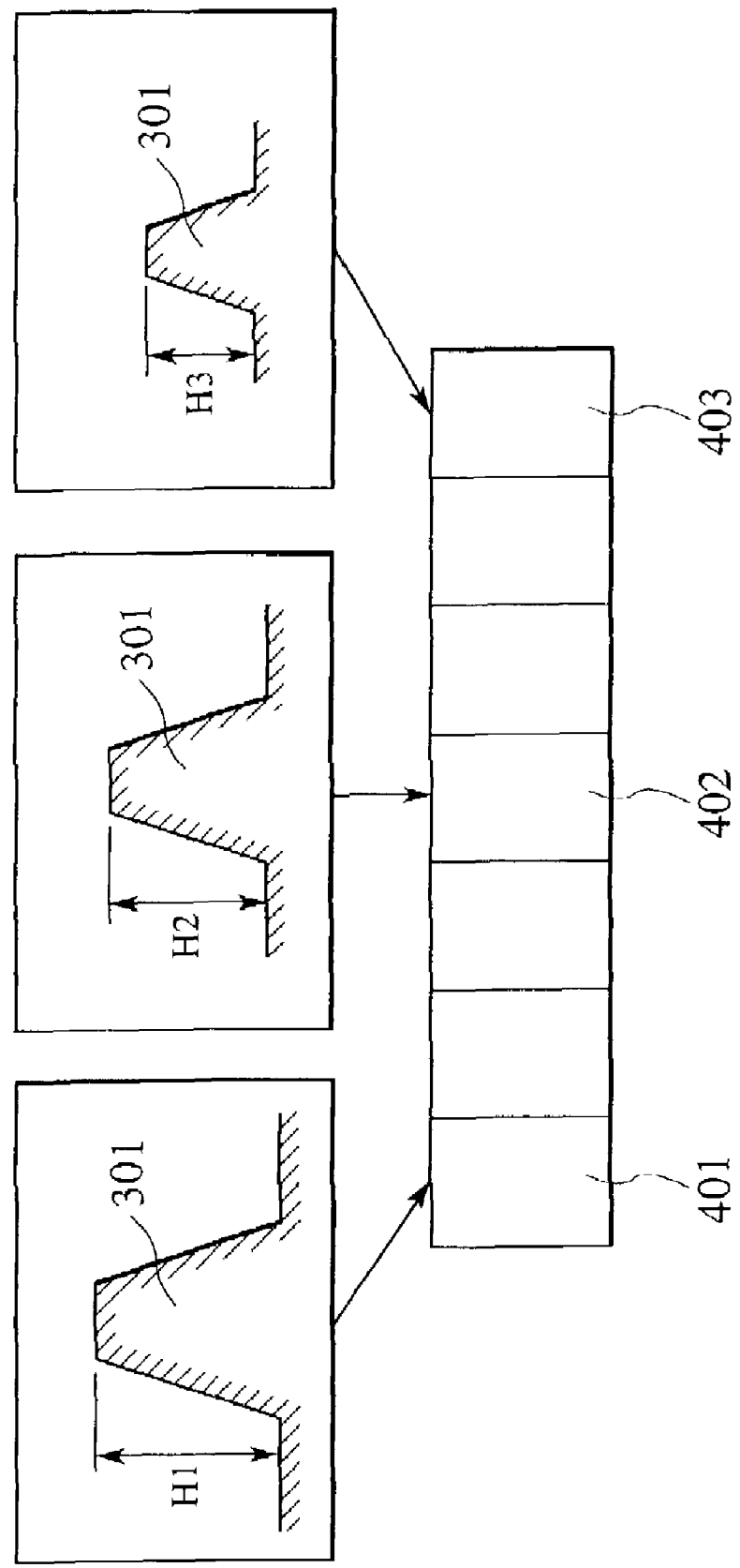

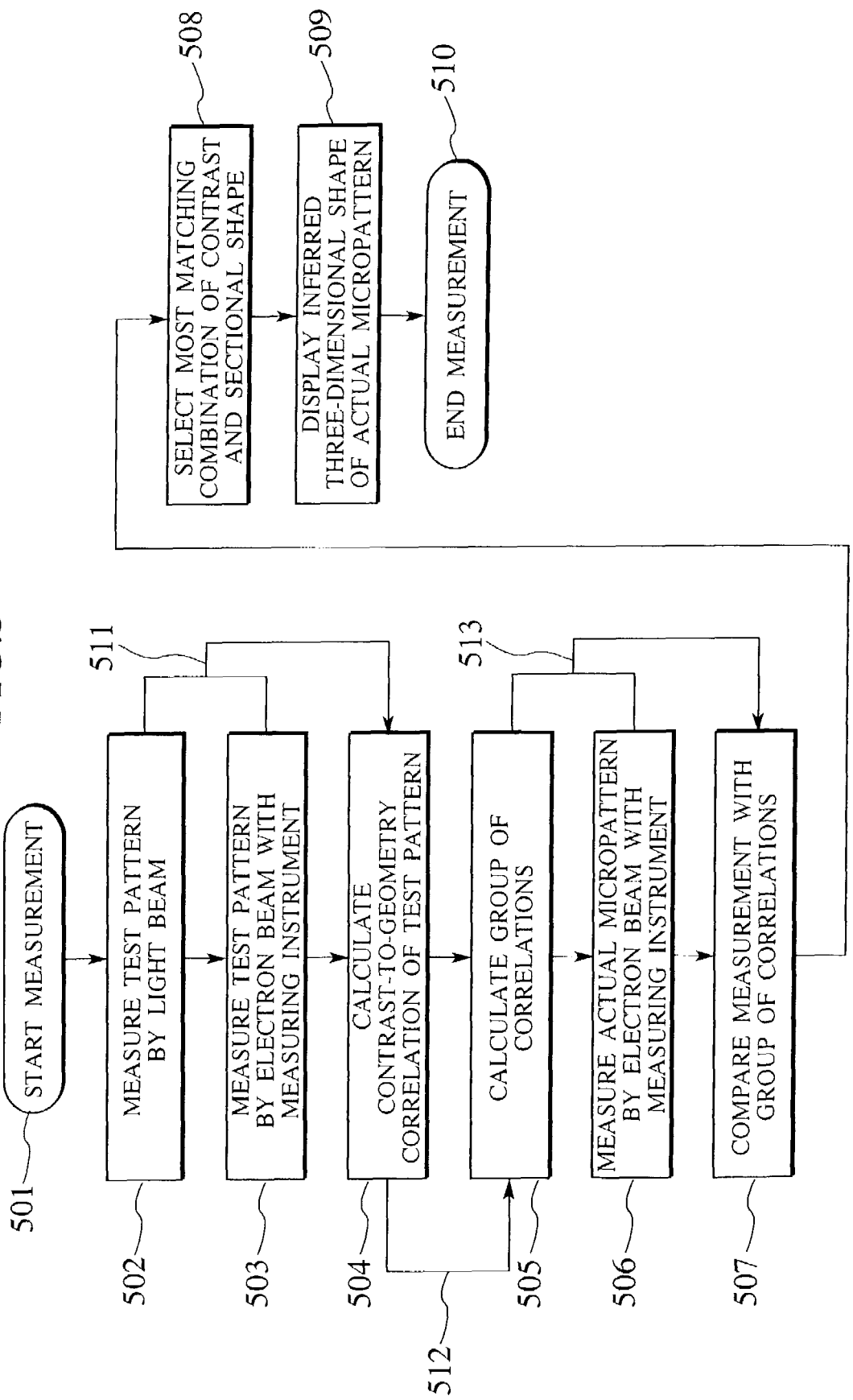

ns in which:

THREE-DIMENSIONAL MICROPATTERN PROFILE MEASURING SYSTEM AND METHOD

BACKGROUND OF THE INVENTION

The present invention relates to a technique for measuring the three-dimensional profile of micropatterns formed in semiconductor memories, integrated operational circuits and other semiconductor devices.

As a technique for measuring the width of a micropattern formed in a semiconductor device, the length-measuring SEM (Scanning Electron Microscopy) is known which emits an electron beam and uses the amplitude of a signal obtained by detecting generated secondary electrons and reflected electrons. However, the length-measuring SEM cannot measure the height of a micropattern although it can measure its very small width. To measure the height, it is therefore necessary to cut the circuit pattern portion of concern in the semiconductor device and observe the cross section under an electron microscope or the like.

One example is disclosed in Japanese Patent Laid-open No. 74326/1999. Such a method cuts a wafer and observes a cross section by using, for example, an electron microscope to measure the height of a pattern. Once the wafer is cut, however, the damaged portions cannot be used to manufacture products. Also it is not sure that the observed portion of the semiconductor device maintains the same size and geometry as before it is cut. Further, such a method requires a long period of time for cutting and observation.

SUMMARY OF THE INVENTION

It is an object of the present invention to provide a three-dimensional profile measurement system and method capable of measuring the three-dimensional profile of a micropattern in a semiconductor device without cutting a wafer.

An embodiment of the present invention comprises a measuring mechanism emitting an electron beam and a measuring mechanism emitting a light beam and profiles a pattern in a semiconductor chip on a wafer by performing the steps of: by irradiating with a light beam a plurality of patterns formed in a test pattern place in a scribe line area of the wafer formed to divide the wafer into a plurality of semiconductor devices, measuring the heights of the plurality of patterns; by irradiating the plurality of patterns with an electron beam, measuring the widths and contrasts of the plurality of patterns; calculating and storing the correlations among the height, width and contrast of each of the plurality of patterns; and determining the height of the pattern in the semiconductor device from the width and contrast obtained by irradiating the pattern with the electron beam and from each of said correlations, wherein the patterns in the test pattern are formed by the same manufacture process as the pattern in the semiconductor device and resemble that pattern in line width and geometry.

BRIEF DESCRIPTION OF THE DRAWINGS

Other objects and advantages of the invention will become apparent from the following description of embodiments with reference to the accompanying drawings in which:

FIG. 4 is a block diagram indicating data locations of a memory where measured values are stored; and FIG. 5 is a flowchart indicating a procedure for three-dimensional profile measurement.

DETAILED DESCRIPTION OF THE PREFERRED EMBODIMENTS

Figure 1:
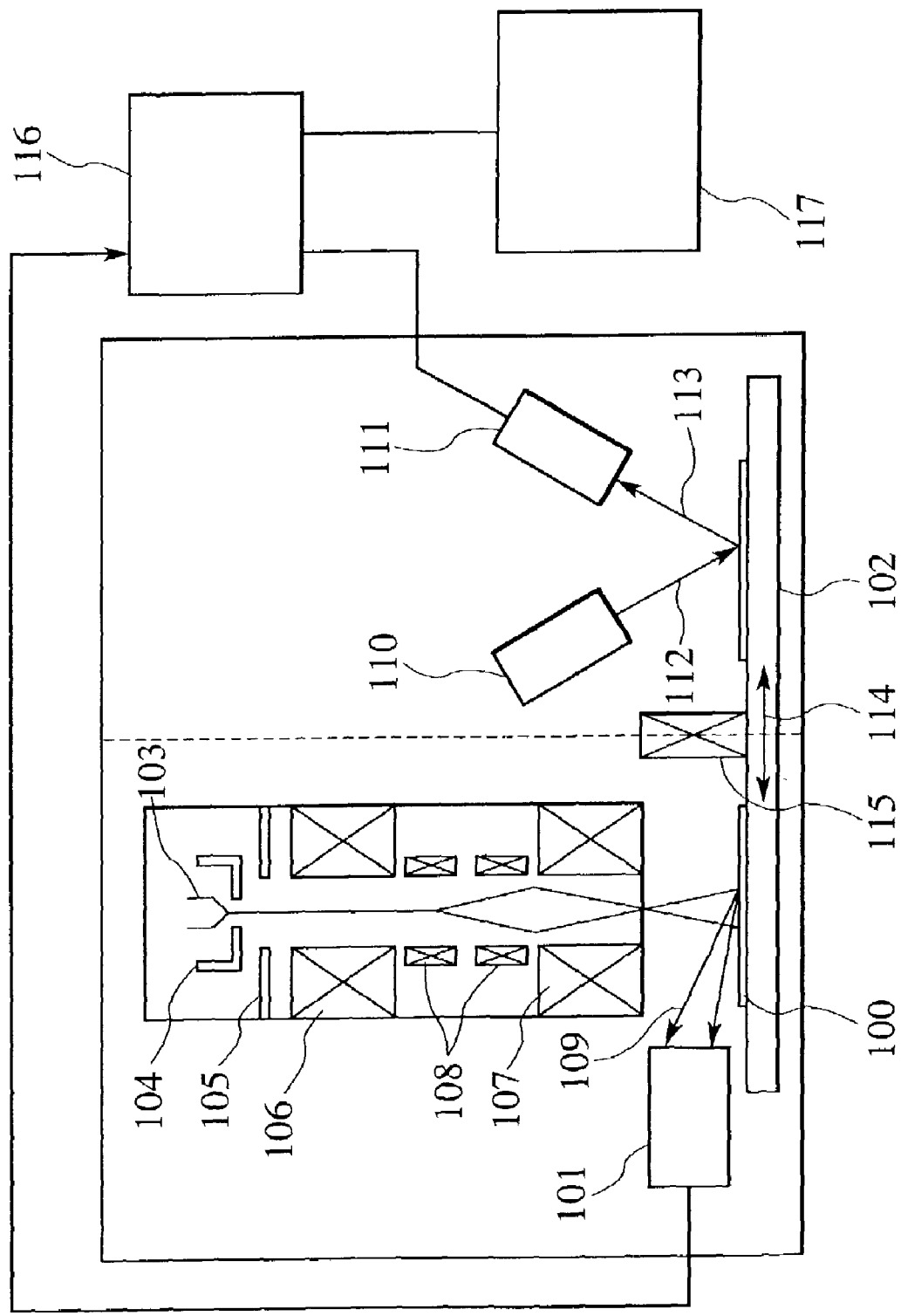
FIG. 1 is a longitudinal sectional view of a semiconductor device inspection apparatus.

Embodiments of the present invention will thereinafter be described with reference to the drawings. FIG. 1 is a longitudinal section of a semiconductor device inspection apparatus in which the present invention is implemented.

This semiconductor device inspection apparatus consists of a part for irradiating a wafer 100 with an electron beam and a part for irradiating the wafer 100 with light. Mounted on a stage 102, the wafer 100 can go back and forth between the two parts as indicated by arrows 114. There is provided an interlock 115 between the two parts so that the part where an electron beam is directed to the wafer 100 is kept vacuum.

The part for irradiating the wafer 100 with an electron beam consists mainly of: an electron source 103; an electron beam extraction electrode 104; an aperture 105 for shaping the electron beam; a condenser electromagnetic lens 106 and an objective electromagnetic lens 107 for converging the electron beam; and a deflector 108 for deflecting the electron beam so as to scan the wafer 100 and for turning the electron beam away from the wafer 100. Secondary electrons and reflected electrons 109, which are generated from the wafer 100 by the scanning electron beam, are detected by a detector 101. An image signal is generated by an image processor 116 from the detected electrons. On a monitor 117, an image is displayed from the image signal.

Meanwhile, in the part for irradiating the wafer 100 with light, a light beam 112 generated from a light beam source 110 is directed to the wafer 100, light 113 is detected by a detector 111, an image signal is generated by the image processor 116 from the detected light and an image is displayed on the monitor 117 from the image signal.

As a light beam-used method for measuring the height of a pattern, such a scatterometric method as disclosed in Japanese Patent Laid-open No. 255751/1996 is known.

The following describes how the above-mentioned semiconductor device inspection apparatus is used to detect the three-dimensional profile of a micropattern.

Figure 2:
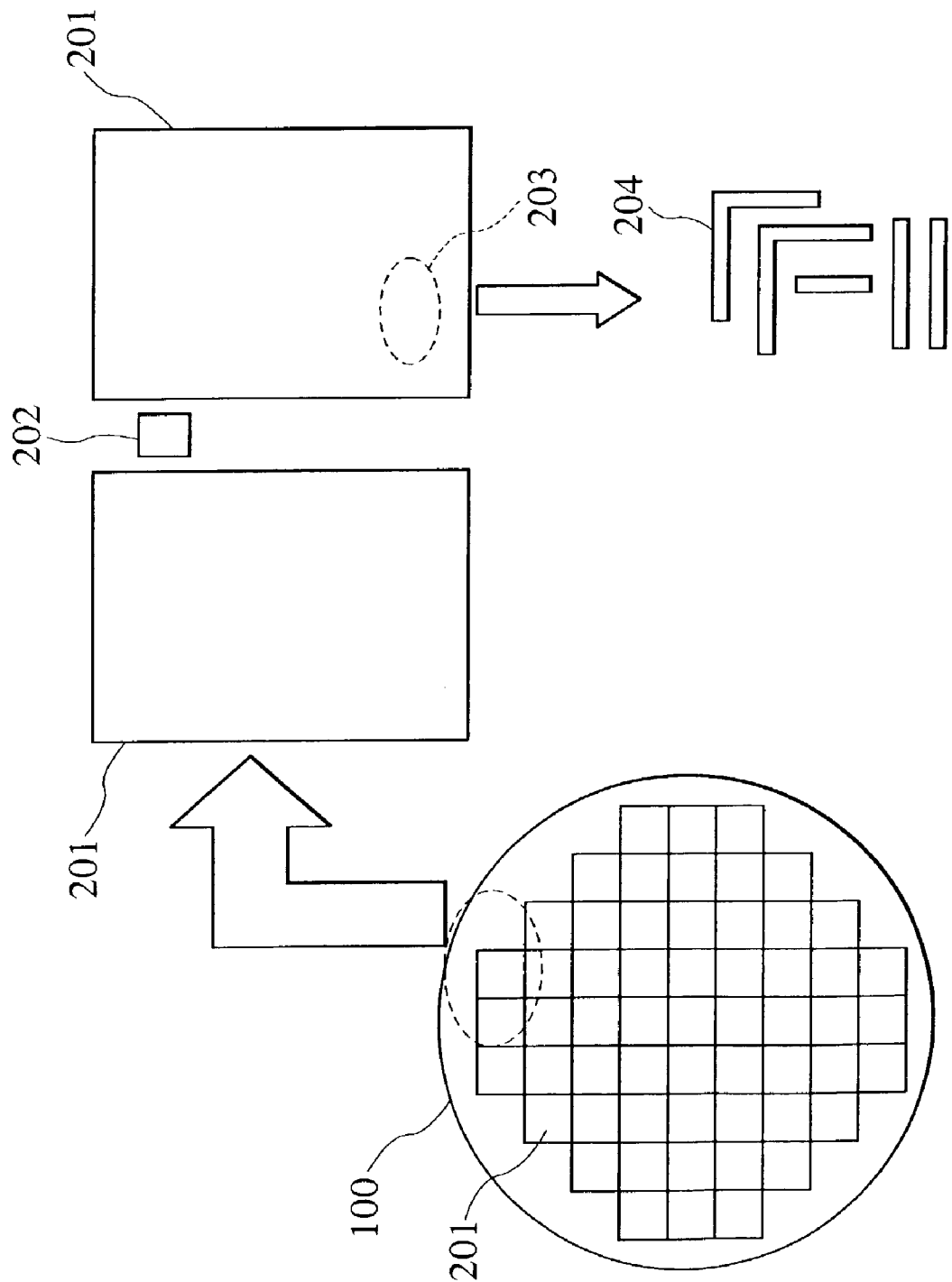
FIG. 2 shows top views of a wafer 100 and its small portion.

FIG. 2 shows top views of a wafer 100 and its small portion. A great number of semiconductor chips 201 are formed on the wafer 100. There is a scribe area between semiconductor chips 201 and cutting is done along the scribe area to finally produce separate semiconductor chips. In this scribe area, a test pattern place 202 is located. Patterns in this place shall be formed by the same process as a representative pattern 204 in a major area 203 to be inspected in a semiconductor chip 201 and shall be designed to resemble the representative pattern 204 in terms of line width and shape.

Figure 3:
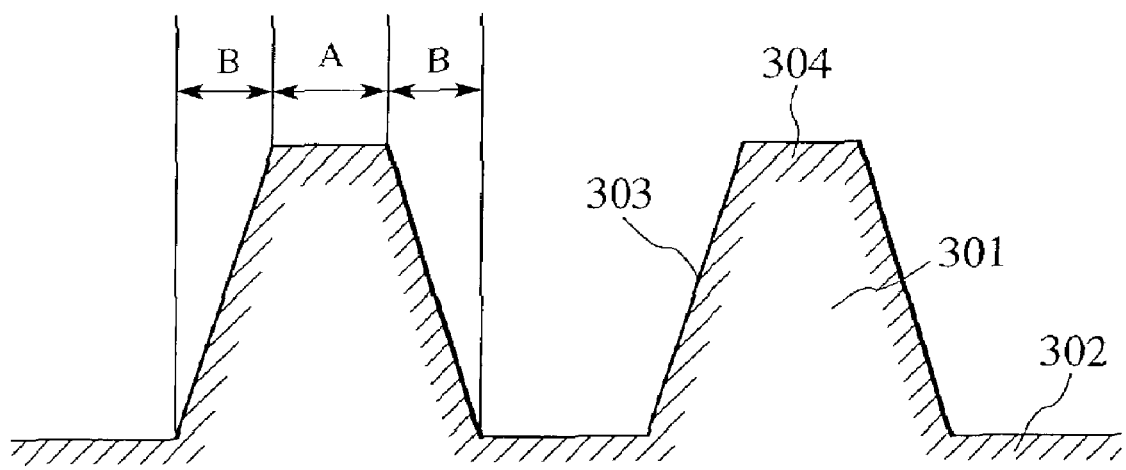
FIG. 3 is a longitudinal sectional view of a pattern 301 in a test pattern place.

FIG. 3 shows a longitudinal section of the pattern 301 in the test pattern place 202. FIG. 4 is a block diagram indicating data locations of a memory where measured values are stored. FIG. 5 is a flowchart indicating a procedure for three-dimensional profile measurement.

First, at step 502 in FIG. 5, a pattern 301 in the pattern place 202 is measured by using a light beam to obtain a height H1 as shown in FIG. 4. Next, patterns 301 having different heights are measured to obtain, for example, heights H2 and H3. Then, the heights H1, H2 and H3 are respectively stored in the data storage locations 401, 402 and 403 of the memory.

At step 503 in FIG. 5, an electron beam is directed to a pattern 301 in the test pattern place 202 to measure the top width A and foot width B of the pattern 301. In addition, the contrast between the pattern 301 and the valley 302, which is attributable to their difference of secondary and reflected electrons generated, is stored as image data. The same measurement step is also performed for the other patterns having different heights shown in FIG. 4.

The dimensional data and contrast data obtained by the above measurement is stored in the memory. Then, at step 504, a computer such as the image processor 116 is used to calculate the correlation between the dimensional data and contrast data for each test pattern and stores the correlation in the memory. In the calculation of correlations at step 504 in FIG. 5, measured data obtained respectively with a light beam and an electron beam are used as indicated by an arrow 511.

Then at step 505, a group of correlations is calculated for patterns which are not actually measured by inferring from the results obtained at step 504 as indicated by an arrow 512.

Then at step 506, an electron beam is directed to the representative pattern 204 in the semiconductor chip 201 shown in FIG. 2 to measure its widths A and B and contrast as defined in FIG. 3.

At step 507, as indicated by an arrow 513, the widths A and B and contrast measured at step 506 are compared with the group of correlations obtained at step 505. Then at step 508, the most matching measured value set is selected to determine the height of the pattern 301.

Then at step 509, a three-dimensional pattern whose widths and height are obtained at step 508 is displayed on the monitor 117.

As mentioned above, it is possible to determine the three-dimensional profile of a micropattern in a semiconductor device by measuring the pattern with an electron beam without cutting the wafer since the height is inferred from the data obtained about a test pattern formed in the scribe area of the wafer by using a light beam and an electron beam.

Although in this embodiment, the test pattern formed in the scribe area is a line and space pattern consisting of a repeated combination of a long and narrow ridge and valley, the same concept can be applied to any pattern such as repeated holes in order to detect the three-dimensional profile and eliminate the time and cost wasted for wafer cutting.

For accurate height inference, the test pattern in the scribe area must be formed to the same geometry by the same process as the corresponding pattern in the semiconductor device.

As described so far, the present invention can provide a three-dimensional profile measurement system and method capable of detecting the three-dimensional shape of a micropattern in a semiconductor device without cutting the wafer.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A three-dimensional micropattern profile measuring system comprising:
   a first measuring mechanism emitting an electron beam;
   a second measuring mechanism emitting a light beam;
   a storage unit for storing heights of a plurality of patterns formed in a test pattern place in a scribe line area of a wafer formed to divide the wafer into a plurality of semiconductor devices, said heights being obtained by irradiating the plurality of patterns with the light beam, and widths and contrasts of the plurality of patterns obtained by irradiating the plurality of patterns with the electron beam; and
   a calculation unit for calculating correlations among the obtained height, width and contrast of each of the plurality of patterns, and determining the height of a pattern in a semiconductor device from the width and contrast obtained by irradiating the pattern with the electron beam and from each of said correlations.

2. A three-dimensional micropattern profile measuring system according to claim 1, wherein the patterns in the test pattern place are formed by the same manufacture process as the pattern in the semiconductor device.

3. A three-dimensional micropattern profile measuring method comprising the steps of:
   irradiating with a light beam a plurality of patterns formed in a test pattern place in a scribe line area of a wafer formed to divide the wafer into a plurality of semiconductor devices so as to measure the heights of the plurality of patterns;
   irradiating the plurality of patterns with an electron beam so as to measure the widths and contrasts of the plurality of patterns obtained;
   storing the heights, widths and contrasts of the plurality of patterns;
   calculating and storing the correlation among the height, width and contrast of each of the plurality of patterns; and
   determining the height of a pattern in a semiconductor device from the width and contrast obtained by irradiating the pattern with the electron beam and from said correlation.

4. A three-dimensional micropattern profile measuring method according to claim 3, wherein the patterns in the test pattern place are formed by the test pattern place are formed by the same manufacture process as the pattern in the semiconductor device.

* * * * *